United States Patent [19]

Lawrence

[11] 4,262,257
[45] Apr. 14, 1981

[54] PEAK DETECTOR

[75] Inventor: Charles E. Lawrence, Boerne, Tex.

[73] Assignee: Datapoint Corporation, San Antonio, Tex.

[21] Appl. No.: 53,545

[22] Filed: Jun. 29, 1979

[51] Int. Cl.³ .......................................... H03K 5/153
[52] U.S. Cl. ................................. 328/150; 307/351; 307/354; 328/114
[58] Field of Search ............... 307/351, 354; 328/114, 328/132, 150, 117, 167; 324/103 P; 360/44, 42

[56] References Cited

U.S. PATENT DOCUMENTS

| | | | |
|---|---|---|---|
| 3,281,806 | 10/1966 | Lawrance et al. | 360/44 |
| 3,304,542 | 2/1967 | Sutton et al. | 360/44 |
| 3,373,415 | 3/1968 | Gabor | 360/44 |
| 3,864,583 | 2/1975 | Fiorino | 307/232 X |
| 4,112,381 | 9/1978 | Mortensen et al. | 328/150 |

OTHER PUBLICATIONS

P. T. Marino, Data Demodulation Employing Integration Techniques, IBM Technical Disclosure Bulletin, vol. 17, No. 2, Jul. 1974, p. 453.

B. C. Fiorino, Detection of Digital Data Using Integration Techniques, IBM Technical Disclosure Bulletin, vol. 16, No. 7, Dec. 1973, pp. 2416-2417.

S. Av et al., Data Detection Circuit, IBM Technical Disclosure Bulletin, vol. 18, No. 11, Apr. 1976, pp. 3821-3822.

Primary Examiner—John Zazworsky
Attorney, Agent, or Firm—Soules, McCamish, Ingram, Martin & Brown, Inc.

[57] ABSTRACT

A peak detecting network utilizes a passive integrating filter to translate the peaks of an input signal into zero crossings of a translation signal, while providing a high degree of noise rejection and preventing the build-up of a DC component in the translation signal. The peak detecting network includes a sine pulse-forming filter comprised of a parallel cascade of a DC shunt inductor, a plurality of series LC sections, and a terminating capacitor. The series LC sections are characterized by respective transfer functions whose impulse responses are substantially finite time duration sine pulses of a successive number of cycles. A rectifier network applies a rectified input signal to the sine pulse-forming filter. A buffer network taps the response of the LC section associated with a one-cycle sine pulse impulse response. The resulting translation signal has a positive-going zero crossing corresponding in time to the occurrence of a peak of the rectified input signal. A positive-going zero crossing detector then detects the sequence of positive-going zero crossings of the translation signal in order to retrieve the sequence of the peaks of the input signal.

11 Claims, 3 Drawing Figures

PEAK DETECTOR

FIELD OF THE INVENTION

The present invention generally relates to peak detecting networks, and more particularly to peak detecting networks that perform an integration of an input signal in order to provide a zero crossing indication of the occurrence of a signal peak while reducing the effects of superimposed noise.

BACKGROUND OF THE INVENTION

In many communications and data processing applications it is necessary to accurately detect the peaks of an input voltage signal. For example, the process of reading digital data written onto a recording medium, such as a disc, results in an alternating read signal in which the information is contained in the phases of the signal peaks. The information is recovered by applying the read signal to a peak detecting network that provides a sequence of indications, typically in the form of logic level transitions, corresponding in time to the peaks of the input read signal.

The actual detection of the peaks of an input signal is frequently accomplished by translating these peaks into corresponding zero crossings of a peak detector signal, and thereafter sensing the occurrence of the resulting zero crossings by means of a comparator network. The translation of the input signal peaks into zero crossings of the peak detector signal is typically accomplished by applying a 90° phase shift to the input signal by either signal integration or signal differentiation.

The most commonly used approach to peak detection has been to differentiate an input signal to obtain a differentiated signal having zero crossings corresponding to the peaks of the input signal. Because the differentiation process provides an output that corresponds at each instance of time to the differential of the input signal, differentiating peak detectors have generally been susceptible to high frequency noise and transient voltage spikes. In particular, the spectral response of the differentiator is such that the differentiator amplifies high frequency noise more than the signal. Also, the amplitudes of transient voltage spikes are often comparable to the amplitude of the input signal peaks that must be detected, thus making detection difficult and unreliable. As a result, differentiating peak detectors must commonly employ fairly complex noise rejection circuitry in order to reliably detect the peaks of the input signal.

It has been suggested that integrating peak detectors be used in order to avoid the noise susceptability of differentiating peak detectors. The integration process is inherently less noisy because it looks at the energy in a signal over a period of time, and not just at an instantaneous differential value. Thus, integration can be used to substantially reduce the effect of high frequency noise, since, even though the amplitude of the noise may be large, the integrated value of the noise over the period of the lower frequency input signal averages out to be extremely small. In other words, the spectral response of an integrator is much more band width-limited than that of a differentiator.

Notwithstanding the inherent noise rejection properties of integration, currently available integrating peak detectors do have a number of disadvantages. First, integrators produce a slowly varying DC component as part of their output waveforms. If the integrating peak detector merely compares the integrator signal to a fixed ground or reference level, then peak detection is susceptible to errors caused by a sufficiently large DC component of the integrator signal. Additional errors may result because the slowly varing DC component causes some peaks to be detected earlier or later in time than their actual time of occurrence. The latter situation is particularly unacceptable in those applications, such as the data processing application mentioned above, in which the accurate retrieval of the information contained in an input signal depends upon preserving the precise peak phase relationships of the input signal. Accordingly, in order to take advantage of the inherent noise rejection properties of an integration approach to peak detection, it has been heretofore necessary to incorporate circuitry designed to counteract the problem of a slowly varying DC component in the output of a peak detecting integrator.

It is a general object of the present invention to provide a relatively uncomplicated network to detect the occurrence and sequence of the peaks of an input signal. To this end, it is a specific object of the present invention to provide a peak detecting network exhibiting a high degree of immunity to superimposed high frequency noise and noise voltage spikes.

It is a further object of the present invention to provide such a peak detecting network that substantially avoids the build-up of a DC component and that exhibits a high degree of immunity to low freqency noise without having to incorporate additional circuitry expressly for this purpose.

It is another object of the present invention to provide such a peak detecting network utilizing a passive filter network rather than active differentiation or integration circuitry.

SUMMARY OF THE INVENTION

Briefly, to achieve these objects and others that will be apparent to those of ordinary skill in the art, the present invention provides a peak detecting network including a passive filter characterized by an integerating transfer function whose impulse response is a finite time duration sine pulse of one cycle, with the response duration of the integration transfer function being less than or substantially equal to the average time interval between the peaks of an input signal. Such a filter can comprise a sine pulse-forming filter formed by a parallel cascade of tuned reactance sections characterized by respective transfer functions whose impulse responses are substantially finite time duration sine pulses of a successive number of cycles. An input signal is applied to the sine pulse-forming filter and a buffer circuit is used to tap the response of the tuned reactance section that is characterized by the one-cycle sine pulse impulse response, thereby providing the peak translation signal. The peak translation signal, which corresponds to the convolution of the input signal with the integrating transfer function, is applied to a zero crossing detector network that provides an indication signal corresponding in time to the occurrence of a zero crossing of the translation signal, and thereby corresponding in time to the occurrence of a peak of the input signal.

A preferred peak detecting network includes a sine pulse-forming filter comprised of a parallel cascade of a DC shunt inductor, a plurality of series LC sections, and a terminating capacitance. The input signal is first rectified before being applied to the sine pulse-forming filter. As a result, the translation signal corresponding to the response of the integration transfer function (i.e., the transfer function having a one-cycle sine pulse impulse response) to the rectified input signal has a positive-going zero crossing associated with each peak of the input signal. The zero crossing detector network provides a logic level transition corresponding in time to the occurrence of a positive-going zero crossing of the translation signal. Because the integrating transfer function, (i.e., that having a one-cycle sine pulse inpulse response), is characterized by a limited frequency spectrum, the integration process embodied in the convolution of the input signal with the integrating transfer function provides a high degree of high frequency noise and transient voltage spike rejection. Also, because the integrating transfer function exhibits a finite time duration, there is no DC component build-up in the translation signal. Accordingly, the zero crossings of the translation signal associated with the peaks of the input signal can be accurately detected.

BRIEF DESCRIPTIONS OF THE DRAWINGS

DESCRIPTION OF THE PREFERRED EMBODIMENT

Figure 3:
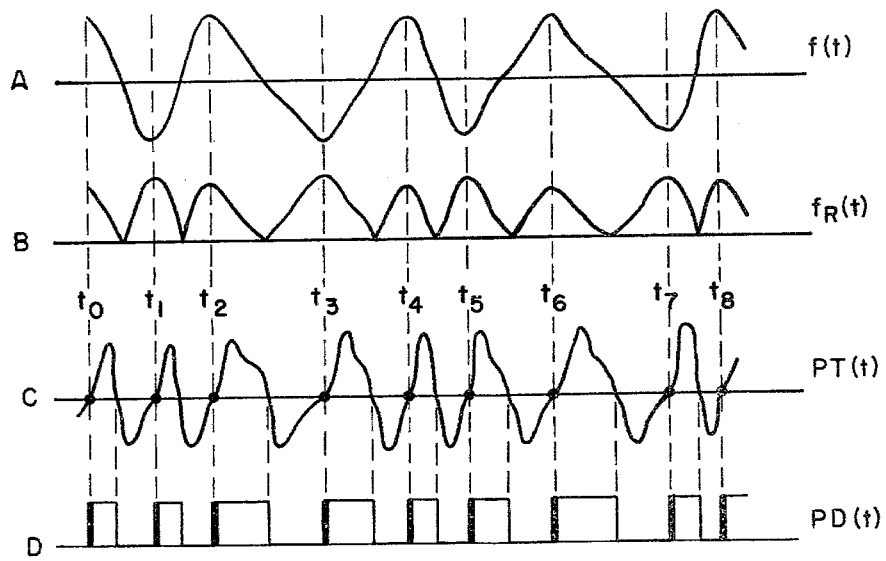
FIG. 3 is a timing diagram showing representative waveforms corresponding to the signals that can be expected at various points of the peak detecting network of the present invention.

The peak detecting network of the present invention utilizes a passive filter to translate the peaks of an input signal into corresponding zero crossings of a peak translation signal; the peak translation signal results from the convolution of the input signal with the integrating transfer function of the filter, whose impulse response has a zero crossing at the impulse peak. In other words, the passive filter is characterized by an integrating transfer function that translates the peaks of the input signal into zero crossings of an output peak translation signal. The integration function embodied in the convolution response of the integrating transfer function enables the peak detecting network to incorporate the noise rejection properties inherent in integrating peak detectors without introducing a slowly varying DC component. To this end, the integrating transfer function embodies the following two conditions:

(1) The impulse response of the integrating transfer function is of a predetermined finite time duration; and (2) The integrating transfer function has a limited frequency spectrum. Incorporating the first condition prevents the build-up of a DC component in the output peak translation signal, and insures that the process of translating a peak of the input signal into a zero crossing does not affect the translation of adjacent peaks (i.e., intersymbol cross talk is not introduced). Incorporating the second condition insures that the effect of the integration process embodied in the convolution response of the integrating transfer function is the attenuation of superimposed high frequency noise, so that the signal-to-noise ratio is not significantly degraded.

The peak detection technique of the present invention involves convolving an alternating input voltage signal f(t) with an integrating transfer function whose impulse response I(t) is a finite time duration sine pulse of one complete cycle. Such an inpulse response can be expressed according to the following relationships:

$$I(t) = \sin 2\pi t \quad 0 < t < \tau \tag{1}$$

$$I(t) = 0 \quad t < 0, \ t > \tau \tag{2}$$

where $\tau$ is the predetermined duration of the sine pulse. The one-cycle sine pulse impulse response of the integrating transfer function has a zero crossing occurring precisely at the peak of the impulse. Therefore, the convolution response of the integrating filter transfer function to any pulse (i.e., to the alternating pulses of an input signal) will have a zero crossing corresponding in time to the occurrence of the pulse peak. Thus, the sequence of peaks of the input signal will be translated into a corresponding sequence of zero crossings of zero crossings of a peak translation signal. The sine pulse duration interval $\tau$ is chosen to be less than or substantially equal to the average time between the peaks of the input signal, thereby preventing the build-up of a DC output component and avoiding intersymbol cross talk. By utilizing an integrating transfer function whose impulse response is a one-cycle sine pulse, the frequency spectrum of the filter response is sufficiently band width-limited that the signal-to-noise ratio is not significantly degraded by the integration process embodied in the response of the integrating transfer function.

For a preferred embodiment, the peak detecting network utilizes a sine pulse-forming filter in order to provide the above described integrating transfer function. The sine pulse-forming filter is described in an article entitled *Trigonometric Pulse-Forming Networks Revisited*, published in the July, 1972 issue of IEEE Transactions on Circuit Theory, which is hereby incorporated by reference. Disclosed therein is a method for synthesizing a multi-section filter such that each section approximates an harmonic transfer function whose impulse response is a substantially finite time duration sine pulse of a successive number of cycles. These sine pulses (normalized to have a unit time duration) can be expressed by the following relationships:

$$I_k(t) = \sin k\pi t \quad 0 < t < 1 \tag{4}$$

$$I_k(t) = 0 \quad t > 1, \ t < 0 \tag{5}$$

where k is an even integer. The harmonic transfer functions corresponding to these sine pulses can be characterized by their Laplace transforms:

$$I_k(s) = \frac{k\pi}{S^2 + k^2 \pi^2} \cdot \frac{2}{1 + \coth S/2} \tag{6}$$

where, again, k is an even integer.

The accurate approximation of these transfer functions can be accomplished utilizing tuned reactance functions (i.e., functions corresponding to circuit elements composed of inductors and/or capacitors) terminated by a correcting reactance function. Specifically, a sine pulse-forming filter can be synthesized from a parallel cascade of a DC shunting inductor, a plurality of series LC sections, and a terminating capacitor. Through the proper choice of component parameters and the total number of sections, the respective transfer functions of the LC sections can be characterized by impulse responses that are sine pulses of an even number of cycles having a substantially finite time duration interval $\tau$. In particular, the proper choice of a terminating reactance function (such as terminating capacitor) significantly improves the convergence of the sine pulses to zero, thereby permitting such a sine pulse-forming filter to be formed by a relatively small total number of cascaded LC sections. While the duration interval $\tau$ is chosen for the preferred embodiment, a duration of less than $\tau$ could be incorporated by appropriate component selection.

Figure 1:
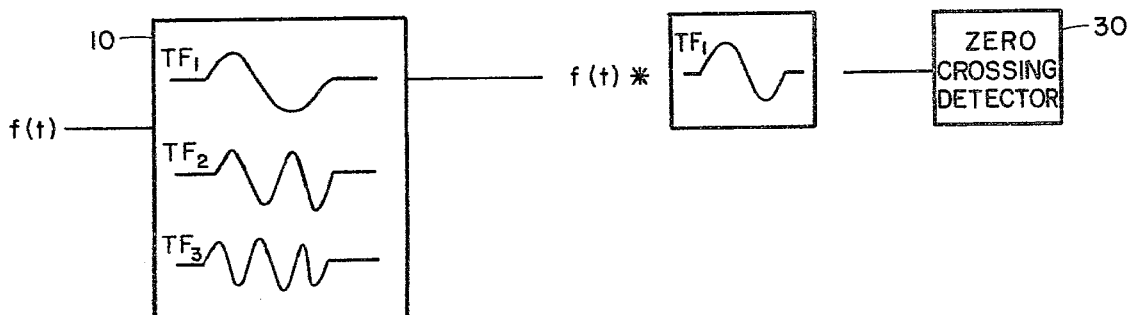
FIG. 1 is a schematic block diagram of the peak detecting network according to the present invention.

Referring to the schematic block diagram in FIG. 1, a sine pulse forming filter 10 comprises a plurality of sections characterized by transfer functions whose impulse responses are finite time duration sine pulses of a successive number of cycles. Thus, the inpulse response of a transfer function $TF_1$ is a one-cycle sine pulse, the impulse response of a transfer function $TF_2$ is a two-cycle sine pulse and the impulse response of a transfer function $TF_3$ is a three-cycle sine pulse, and so on. An input signal f(t) is applied to the sine pulse-forming filter 10 and the convolution response of the section characterized by the integrating transfer function $TF_1$ (i.e., that having a one-cycle sine pulse impulse response) is tapped to obtain a peak translation signal in which the peaks of the input signal are translated into zero crossings. The peak translation signal results from the convolution of the input signal f(t) with the integrating transfer function $TF_1$, thus corresponding to an integration of the input signal. In order to detect the occurrence of the input signal peaks, the peak translation signal is applied to a zero crossing detector 30 that provides an logic level transition indication for each zero crossing that corresponds to a peak of the input signal f(t).

Figure 2:
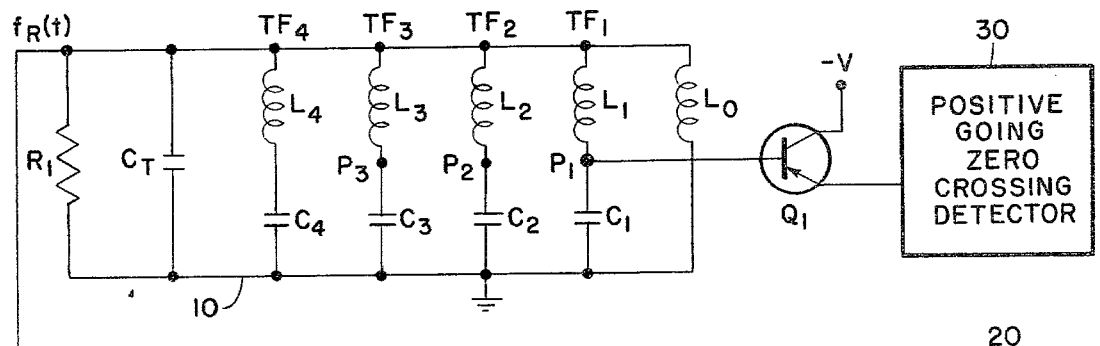
FIG. 2 is a schematic circuit diagram of the peak detecting network.
Figure 2:
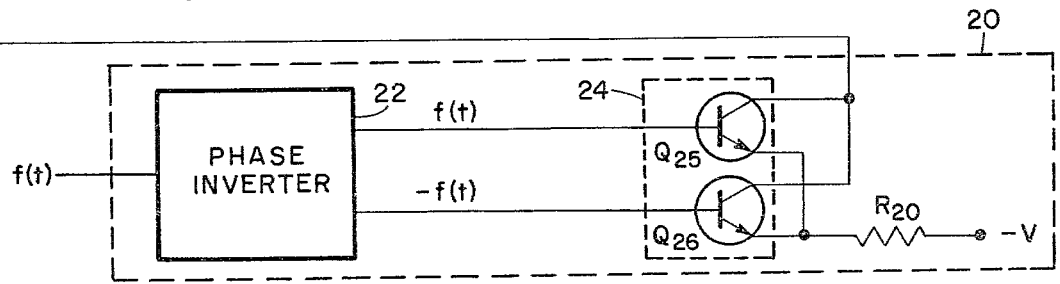

Referring to the circuit diagram in FIG. 2, sine pulse forming filter 10 includes a parallel cascade of a DC shunt inductor $L_O$, four series LC sections, and a terminating capacitor $C_T$. The DC shunt inductor $L_O$ shunts any zero frequency component of the input to the filter, thereby preventing a DC component build-up. The tuned LC sections are formed by, respectively, an inductor $L_1$ in series with a capacitor $C_1$ characterized by the transfer function $TF_1$, an inductor $L_2$ in series with a capacitor $C_2$ characterized by the transfer function $TF_2$, an inductor $L_3$ in series with the capacitor $C_3$ characterized by the transfer function $TF_3$, and an inductor $L_4$ in series with a capacitor $C_4$ characterized by the transfer function $TF_4$. In accordance with the foregoing discussion of sine pulse-forming filters, the component parameters for sine pulse-forming filter 10 are chosen so that the respective transfer functions characterizing the series LC sections have impulse responses that are finite time duration sine pulses of, successively, one, two, three and four cycles, having a duration interval $\tau$.

In order to insure that the series LC sections of sine pulse-forming filter 10 are characterized by transfer functions that are substantially finite time duration sine pulses, the value of resistors R1 and the values of each of the inductors and capacitors that form the sine pulse-forming filter 10 must be carefully chosen. By performing the analysis disclosed in the hereinbefore referenced article, it can be established that the normalized component values (i.e., the component values that yield transfer functions whose impulse responses are sine pulses of a duration of one second) are designated by the following relationships:

$$R_1 = 1 \tag{7}$$

$$L_0 = 0.5 \tag{8}$$

$$L_k = 0.25 \tag{9}$$

$$C_k = \frac{1}{1/k^2 \pi^2} \tag{10}$$

$$C_T = 0.02047 \tag{11}$$

where k is an even integer. The value of the terminating capacitor $C_T$ is derived by means of the curve fitting techniques disclosed in the article. While other terminating reactance functions (such as a terminating series LC section) can be utilized, specifying a single terminating capacitor results in adequate convergence of the transfer function responses to zero.

The normalized component values can be translated into actual values for a preferred peak detecting network as follows. R1 can be arbitrarily chosen subject to the limitations that its value not be so high as increase noise, and not be so low as to make it difficult to drive the sine pulse-forming filter 10. For a perferred embodiment, the value of R1 is set at 200 ohms. Once the value of R1 has been specified, the actual component values for the inductors and capacitors of the sine pulse filter 10 are chosen to provide a substantially finite time duration interval (the average duration between the peaks of the input signal) in accordance with the following relationships:

$$L_{actual} = L_{normal} \frac{T_{actual}}{T_{normal}} \frac{R_{actual}}{R_{normal}} \tag{12}$$

$$C_{actual} = C_{normal} \frac{T_{actual}}{T_{normal}} \frac{R_{normal}}{R_{actual}} \tag{13}$$

where $L_{normal}$ and $C_{normal}$ are the normalized values of inductance and capacitance given by equations 4, 5, 6, and 7; $T_{actual}$ and $T_{normal}$ are, respectively the actual duration interval $\tau$ and the normalized duration of one second; and $R_{actual}$ and $R_{normal}$ are, respectively, the actual impedance of 200 ohms and the normalized impedance of one ohm.

The number of LC sections in the sine pulse-forming filter 10 (along with the choice of the value of terminating capacitor $C_T$) determines the degree to which the respective responses of the LC sections converge to zero outside the duration interval $\tau$. In this context, the total number of LC sections incorporated into sine pulse-forming filter 10 is a matter for design. For the preferred embodiment, a parallel cascade of four LC sections is disclosed. Specifying fewer LC sections would decrease the convergence to zero of the transfer function responses associated with the remaining LC sections, while additional LC sections would increase the converging effect.

The input signal f(t) is rectified prior to being applied to sine pulse forming filter 10. The rectification of the input signal is not essential to the operation of the peak detecting network, the input signal could be applied directly to the sine pulse-forming filter 10. However, the rectification of the input signal f(t) results in an output peak translation signal from sine pulse forming-filter 10 in which the peaks of the rectified input signal are translated into positive-going zero crossings of the peak translation signal. Accordingly, these zero crossings can be detected by a detector network incorporating only positive-going zero crossing detection. Thus, the choice between providing either circuitry for rectifying the input signal, or circuitry for detecting both positive- and negative-going zero crossings is a matter for design.

The peak detection network illustrated in FIG. 2 includes a rectification network 20. The input signal f(t) is applied to a phase inverter circuit 22 that outputs separate signals corresponding to the input signal f(t) and its inverse, −f(t). The input signal f(t) and its inverse are applied to a differential amplifier network 24 that includes transistors Q25 and Q26. The input signal f(t) from the phase inverter is applied to the base of transistor Q25, while its inverse is coupled to the base of transistor Q26. The emitters of transistors Q25 and Q26 are coupled together through a resistor R20 to a negative bias supply −V, while the collectors of the transistors are connected together and coupled to the sine pulse-forming filter 10.

A conventional phase inverter network can be utilized to perform the phase inversion function of phase inverter 22. The foregoing discussion of the differential amplifier pair 24 omits a discussion of the conventional biasing networks that are typically associated with the differential transistor pair Q25 and Q26.

The use of a phase inverter 22 together with a differential amplifier 24 provides precise rectification of the input signal f(t). By using such a rectifier network, as opposed to a diode rectifier, nearly perfect rectification is obtained, i.e., the rectified signal is characterized by sharp transistions between the rectified pulses. This type of rectification is important if the amplitude of the input signal f(t) can be approximately the 0.7 forward voltage drop of a diode, or less, with the result that the signal peak would be lost during the process of rectification.

The input lead signal f(t) is represented by waveform A in FIG. 3; rectification by rectifier network 20 provides a rectified signal $f_R(t)$ represented by waveform B. The rectified signal $f_R(t)$ is applied to sine pulse-forming filter 10 across resistor $R_1$. As noted above, the technique embodied in the preferred peak detecting network is to tap the response of the L1/C1 section of sine pulse forming-filter 10, corresponding to the convolution of the rectified input signal $f_R(t)$ with the integrating transfer function $TF_1$ whose impulse response is a one-cycle sine pulse. The response of the transfer function associated with a particular LC section appears at a point between the inductor and the capacitor. Thus, the response of the L1/C1 section characterized by transfer function $TF_1$ appears at point P1, while the response of the L2/C2 section appears at point P2, the response of the L3/C3 section appears at point P3 and the response of the L4/C4 section appears at P4.

The peak detector network utilizes a buffer transistor Q1 to tap the convolution response at point P1 without significantly affecting the operation of the sine pulse forming-filter 10. The base of the buffer transistor Q1 is coupled to the point P1 while the collector of the transistor is coupled to a negative bias supply −V. The resulting peak translation signal appears on the emitter of buffer transistor Q1.

Referring to FIG. 3, a peak translation signal PT(t) is represented by waveform C. The peak translation signal is an alternating signal characterized by positive-going zero crossings that correspond in time to the peaks of the rectified input signal $f_R(t)$. Thus, the peaks of the rectified input signal $f_R(t)$ occur at times $t_0, t_1, t_2 \ldots t_8$, while the positive-going zero crossings of the peak translation signal PT(t) occur at these same times. In other words, the interval between the peaks of the rectified input signal $f_R(t)$ are translated into corresponding intervals between positive-going zero crossings of the peak translation signal PT(t) appearing on the emitter of buffer transistor Q1. Because the input to the sine pulse-forming filter 10 is a rectified signal, the peak translation signal completes a full cycle between the zero crossings that correspond to the peaks of the rectified input signal $f_R(t)$. If the unrectified input signal f(t) were to be applied directly to sine pulse-forming filter 10, the peak translation signal PT(t) would complete only a single half cycle between the alternating positive-and negative-going peaks of the input signal. Thus, the peaks of the input signal would be characterized by alternating positive-and negative-going zero crossings of the peak translation signal PT(t).

In order to detect the positive-going zero crossings of the peak translation signal PT(t), and thereby recover the sequence of the peaks of the input signal f(t), the peak translation signal appearing on the emitter of buffer transistor Q1 is applied to a positive-going zero crossing detector 30. The results, as represented by a waveform D in FIG. 3, is a peak detection signal PD(t) characterized by positive logic level transitions at the times $t_0, t_1, t_2 \ldots t_8$ corresponding to the zero crossings of the peak translation signal PT(t). For the particular detection arrangement indicated in waveform D, the output of the positive-going zero crossing detector 30 returns to zero at a time corresponding to the negative going zero crossing (between two positive-going zero crossings) of the peak translation signal (wavefore C), in anticipation of the next positive logic level transition associated with the succeeding zero crossing. The positive-going zero crossing detector 30 can comprise any of the conventional positive-going zero crossing detectors well known in the art.

The present invention has been described in relation to a preferred peak detecting network that utilizes a sine pulse-forming filter to provide an integrating transfer function whose impulse response is a finite time duration one-cycle sine pulse. An input signal f(t) is applied to the sine pulse-forming filter, and the peak detecting network taps the response of the integrating transfer function to the input read signal. As a result, the peaks of the input signal are translated into zero crossings of a peak translation signal, which can then be detected in a conventional manner. The use of a passive filter to translate the peaks of an input signal into zero crossings avoids the noise susceptibility of differentiating peak detectors and the DC component build-up of integrating peak detectors. Also, the spectrum of the integrating transfer function is sufficiently band width-limited that the high frequency noise content of the input signal can be significantly attentuated by the integration process embodied in the response of the integrating transfer function. In addition, the duration of the one-cycle sine impulse response of the integrating transfer function can be limited in a manner to insure that the detection of a given peak does not affect the detection adjacent peaks.

While the invention has therefore been described with respect to a preferred embodiment, it is to be clearly understood by those of ordinary skill in the art that the invention is not limited thereto, but rather than the limits of the invention are to be interpreted only in conjunction with the appended claims.

The embodiments of the invention in which an exclusive property or privilege is claimed are as follows:

1. A peak detecting network for indicating the occurrence of a peak of an alternating current input signal comprising:
    integrating filter means, coupled to receive the input signal, for translating the peaks of the input signal into corresponding zero crossings of a translation signal, such zero crossings corresponding in time to the occurrence of the peaks;
    said integrating filter means being characterized by an integrating transfer function whose impulse response is a substantially finite time duration sine pulse of one cycle, the predetermined duration of the sine pulse being less than or substantially equal to the average time interval between the peaks of the input signal, with the response of the integrating transfer function to the input signal being said translation signal; and
    detector means, response to said translation signal, for providing an indication signal corresponding in time to the occurrence of the zero crossings of the translation signal that corresponds to the peaks of the input signal, and thereby corresponding in time to the occurrence of a peak of the input signal.

2. The peak detecting network defined in claim 1 wherein said indication signal comprises a logic level transition.

3. The peak detecting network defined in claim 1 wherein said filter means comprises:
    a sine pulse-forming filter, coupled to receive said input signal, comprising a cascade of a plurality of tuned reactance sections characterized by respective transfer functions whose impulse responses are substantially finite time duration sine pulses of a successive number of cycles, including at least a one cycle sine pulse, the predetermined duration of the sine pulses being less than or substantially equal to the average time interval between the peaks of the input signal; and
    buffer means for tapping the convolution response of the tuned reactance section having an impulse response that is a one-cycle sine pulse, said tapped convolution response corresponding to the response of the associated transfer function to the input signal.

4. The peak detecting network defined in claim 3 wherein said plurality of tuned reactance sections comprise a parallel cascade of a DC shunt inductor and a plurality of tuned series LC sections each formed by a capacitor in series with an inductor, with the convolution response for reach of said LC sections appearing at a point between the associated capacitor and inductor.

5. The peak detecting network defined in claim 3 wherein said sine pulse-forming filter comprises a parallel cascade of a DC shunt indicator; a plurality of tuned series LC sections each formed by a capacitor in series with an inductor; and a terminating capacitor; the convolution response for each of said LC sections appearing at a point between the associated capacitor and inductor.

6. The peak detecting network defined in claim 5 wherein said indication signal comprises a logic level transition.

7. The peak detecting network defined in claim 1 further including:
    rectifying means for rectifying the input signal such that each peak of the input signal is translated by said integrating filter means into a positive-going zero crossing of the translation signal;
    said detector means providing an indication signal corresponding in time to the occurrence of a positive-going zero crossing of the translation signal.

8. The peak detecting network defined in claim 7 wherein said filter means comprises:
    a sine pulse-forming filter, coupled to receive said input signal, comprising a cascade of a plurality of tuned reactance sections characterized by respective transfer functions whose impulse responses are substantially finite time duration sine pulses of a successive number of cycles, including at least a one cycle sine pulse, the predetermined duration of the sine pulses being less than or substantially equal to the average time interval between the peaks of the input signal; and
    buffer means for tapping the convolution response of the tuned reactance section having an impulse response that is a one-cycle sine pulse, said tapped convolution response corresponding to the response of the associated transfer function to the input signal.

9. The peak detecting network defined in claim 8 wherein said plurality of tuned reactance sections comprises a parallel cascade of a DC shunt inductor and a plurality of tuned series LC sections each formed by a capacitor in series with an inductor, with the convolution response for each of said LC sections appearing at a point between the associated capacitor and inductor.

10. The peak detecting network defined in claim 7 wherein said sine pulse-forming filter comprises a parallel cascade of a DC shunt inductor: a plurality of tuned series LC sections each formed by a capacitor in series with an inductor; and a terminating capacitor; the convolution response for each of said LC sections appearing at a point between the associated capacitor and inductor.

11. The peak detecting network defined in claim 10 wherein said indication signal comprises a logic level transition.

* * * * *